US012571126B2

(12) United States Patent
Sumiya et al.

(10) Patent No.: US 12,571,126 B2
(45) Date of Patent: *\*Mar. 10, 2026**

(54) SINGLE-CRYSTAL DIAMOND, METHOD OF MANUFACTURING THE SAME, AND METHOD OF MANUFACTURING SINGLE-CRYSTAL DIAMOND PLATE

(71) Applicant: SUMITOMO ELECTRIC INDUSTRIES, LTD., Osaka (JP)

(72) Inventors: Hitoshi Sumiya, Osaka (JP); Yoshiki Nishibayashi, Osaka (JP); Yikang Zuo, Osaka (JP); Jin Hwa Lee, Osaka (JP); Minori Teramoto, Osaka (JP); Yutaka Kobayashi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 258 days.

This patent is subject to a terminal disclaimer.

(21) Appl. No.: 18/283,805

(22) PCT Filed: Mar. 28, 2022

(86) PCT No.: PCT/JP2022/015083
§ 371 (c)(1),
(2) Date: Sep. 24, 2023

(87) PCT Pub. No.: WO2022/210566
PCT Pub. Date: Oct. 6, 2022

(65) Prior Publication Data
US 2024/0183070 A1     Jun. 6, 2024

(30) Foreign Application Priority Data

Mar. 31, 2021     (JP) ................................. 2021-061212

(51) Int. Cl.
*C30B 19/12* (2006.01)
*C30B 29/04* (2006.01)

(52) U.S. Cl.
CPC .............. *C30B 29/04* (2013.01); *C30B 19/12* (2013.01)

(58) Field of Classification Search
CPC ......... C30B 29/04; C30B 19/12; C30B 25/02; C23C 16/27
See application file for complete search history.

(56) References Cited

U.S. PATENT DOCUMENTS 5,908,503 A     6/1999  Sumiya et al.
6,030,595 A     2/2000  Sumiya et al.
(Continued)

FOREIGN PATENT DOCUMENTS

JP         5-58786 A      3/1993
JP     H07-116494 A      5/1995
(Continued)

*Primary Examiner* — Robert M Kunemund
(74) *Attorney, Agent, or Firm* — Renner, Otto, Boisselle & Sklar, LLP

(57) ABSTRACT

A single-crystal diamond, wherein the single-crystal diamond has a nitrogen content based on the number of atoms of more than 0.1 ppm and 50 ppm or less, the single-crystal diamond has a boron content based on the number of atoms of 0.1 ppm or less, the single-crystal diamond has an average of a phase difference per unit thickness of 20 nm/mm or less, and the phase difference has a standard deviation of 10 nm/mm or less.

10 Claims, 1 Drawing Sheet

(56)  References Cited

U.S. PATENT DOCUMENTS

| | | |
|---|---|---|
| 2006/0231015 A1 | 10/2006 | Meguro et al. |
| 2007/0036921 A1 | 2/2007 | Twitchen et al. |
| 2009/0258229 A1 | 10/2009 | Summerton et al. |
| 2015/0191850 A1* | 7/2015 | Nishibayashi .......... C30B 29/04 |
| | | 423/446 |
| 2015/0240382 A1 | 8/2015 | Dhillon et al. |
| 2016/0334474 A1 | 11/2016 | Hatano et al. |
| 2020/0283927 A1 | 9/2020 | Sumiya et al. |
| 2021/0268562 A1* | 9/2021 | Nohara ................... C23C 16/27 |
| 2024/0175166 A1* | 5/2024 | Sumiya ................... C01B 32/26 |

FOREIGN PATENT DOCUMENTS

| | | |
|---|---|---|
| JP | H07-148426 A | 6/1995 |
| JP | H09-165295 A | 6/1997 |
| JP | 2009-518259 A | 5/2009 |
| JP | 2014-148463 A | 8/2014 |
| JP | 2015-531337 A | 11/2015 |
| WO | 2014/168053 A1 | 10/2014 |
| WO | 2015/107907 A1 | 7/2015 |
| WO | 2019/077844 A1 | 4/2019 |
| WO | 2021/065258 A1 | 4/2021 |

* cited by examiner

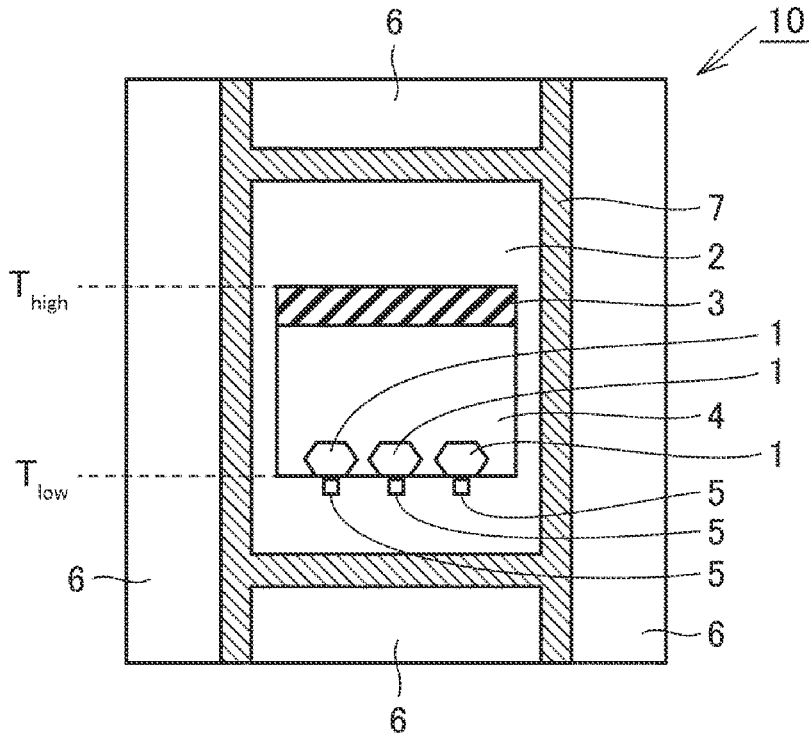

SINGLE-CRYSTAL DIAMOND, METHOD OF MANUFACTURING THE SAME, AND METHOD OF MANUFACTURING SINGLE-CRYSTAL DIAMOND PLATE

TECHNICAL FIELD

The present disclosure relates to a single-crystal diamond, a method of manufacturing the single-crystal diamond, and a method of manufacturing a single-crystal diamond plate. The present application claims priority to Japanese Patent Application No. 2021-061212, filed Mar. 31, 2021. The entire contents of this Japanese patent application are incorporated herein by reference.

BACKGROUND ART

Diamonds have been used in various applications, such as heat sinks, wire-drawing dies, precision machining tools, optical components, laser windows, crystals for spectroscopy, monochromators, anvils for ultra-high pressure generators, and semiconductor diamond substrates. Among these applications, in particular, in the fields of optical components, laser windows, crystals for spectroscopy, monochromators, anvils for ultra-high pressure generators, and semiconductor diamond substrates, diamonds with fewer crystal defects and less distortion have been developed to improve performance (for example, Patent Literature 1 to Patent Literature 3).

CITATION LIST

Patent Literature

PTL 1: Japanese Unexamined Patent Application Publication No. 7-116494
PTL 2: Japanese Unexamined Patent Application Publication No. 7-148426
PTL 3: Japanese Unexamined Patent Application Publication No. 9-165295

SUMMARY OF INVENTION

The present disclosure provides a single-crystal diamond, wherein
the single-crystal diamond has a nitrogen content based on the number of atoms of more than 0.1 ppm and 50 ppm or less,
the single-crystal diamond has a boron content based on the number of atoms of 0.1 ppm or less,
the single-crystal diamond has an average of a phase difference per unit thickness of 20 nm/mm or less, and
the phase difference has a standard deviation of 10 nm/mm or less.
The present disclosure provides a method of manufacturing the single-crystal diamond, the method including:
a first step of preparing a single-crystal diamond material with an average of a phase difference per unit thickness of more than 20 nm/mm and 50 nm/mm or less and a standard deviation of the phase difference of more than 10 nm/mm and 20 nm/mm or less;
a second step of cutting out a diamond seed crystal from the single-crystal diamond material; and
a third step of growing a diamond crystal on the diamond seed crystal by a temperature difference method to manufacture the single-crystal diamond.

The present disclosure provides a method of manufacturing a single-crystal diamond plate having a (111) plane as a main surface, the method including:
a 1A step of preparing a single-crystal diamond material with an average of a phase difference per unit thickness of more than 20 nm/mm and 50 nm/mm or less and a standard deviation of the phase difference of more than 10 nm/mm and 20 nm/mm or less;
a 2A step of cutting out a diamond seed crystal having (111) as a main surface from the single-crystal diamond material to manufacture a {111} diamond seed crystal;
a 3A step of growing a diamond crystal on the {111} diamond seed crystal by a temperature difference method to manufacture a single-crystal diamond; and
a 4A step of cutting out a plate from a {100} sector of the single-crystal diamond to manufacture the single-crystal diamond plate having the (111) plane as a main surface.

BRIEF DESCRIPTION OF DRAWINGS

FIG. 1 is a schematic view of a sample chamber used in the method of manufacturing a single-crystal diamond according to the second embodiment.

DESCRIPTION OF EMBODIMENTS

Problems to be Solved by Present Disclosure

In recent years, in applications of precision cutting tools, infrared optical components (for example, window materials for lasers, pressure cells, and prisms), and materials for magnetic sensors, further reduction of crystal defects and distortion has been desired to improve performance.
Accordingly, it is an object of the present disclosure to provide a single-crystal diamond with fewer crystal defects and less distortion. It is another object of the present disclosure to provide a single-crystal diamond plate with fewer crystal defects and less distortion.

Advantageous Effects of Present Disclosure

The present disclosure can provide a single-crystal diamond with fewer crystal defects and less distortion. The present disclosure can also provide a single-crystal diamond plate with fewer crystal defects and less distortion.

Description of Embodiments of Present Disclosure

First, embodiments of the present disclosure are described below.
(1) The present disclosure provides a single-crystal diamond, wherein
the single-crystal diamond has a nitrogen content based on the number of atoms of more than 0.1 ppm and 50 ppm or less,
the single-crystal diamond has a boron content based on the number of atoms of 0.1 ppm or less,
the single-crystal diamond has an average of a phase difference per unit thickness of 20 nm/mm or less, and
the phase difference has a standard deviation of 10 nm/mm or less.
A single-crystal diamond according to the present disclosure has fewer crystal defects and less distortion. Thus, a single-crystal diamond according to the present disclosure used for a precision cutting tool improves the strength and fracture resistance of the tool. A single-crystal diamond according to the present disclosure used as a window material for a laser improves transmittance. A single-crystal diamond according to the present disclosure used for a pressure cell improves the strength and fracture resistance of the pressure cell. A single-crystal diamond according to the present disclosure used as a prism improves resolution. A single-crystal diamond according to the present disclosure used for a material for a magnetic sensor improves the sensitivity of the magnetic sensor.

(2) Preferably, the single-crystal diamond has a dislocation density of $10^2/cm^2$ or less, and the dislocation density is measured in an etching test.

This provides a single-crystal diamond with high crystallinity.

(3) Preferably, the single-crystal diamond has a first region of 1 mm$^2$, wherein the first region has no defect, and the presence or absence of the defect is determined in an X-ray topographic image of the single-crystal diamond.

This provides a single-crystal diamond with high crystallinity.

(4) Preferably, the single-crystal diamond has a crack initiation load of 10 N or more. This provides the single-crystal diamond with high breaking strength and fracture resistance. For example, the single-crystal diamond used as a cutting tool can provide the cutting tool with high fracture resistance.

(5) Preferably, the single-crystal diamond has a vicinal growth trace. The vicinal growth trace originates from a boundary between different growth sectors in the single-crystal diamond. In the single-crystal diamond with higher crystallinity, the boundary is clearer, and the vicinal growth trace is easier to identify. Thus, the single-crystal diamond with a vicinal growth trace has high crystallinity. The vicinal growth trace is identified in a single-crystal diamond synthesized by a temperature difference method at high pressure and temperature. Thus, the single-crystal diamond with a vicinal growth trace is synthesized by the temperature difference method at high pressure and temperature. The single-crystal diamond synthesized by the temperature difference method at high pressure and temperature has much higher crystal growth stability, much fewer crystal defects, and much less residual distortion than single-crystal diamonds synthesized by a solubility difference method at high pressure and temperature (a film growth method) or by a gas-phase synthesis method (a CVD method). Thus, the single-crystal diamond synthesized by the temperature difference method has higher crystallinity than single-crystal diamonds synthesized by other methods, and among crystals synthesized by the temperature difference method, a crystal with higher crystallinity has a vicinal growth trace as described above.

(6) A method of manufacturing a single-crystal diamond according to the present disclosure is a method of manufacturing the single-crystal diamond described above, the method including:

a first step of preparing a single-crystal diamond material with an average of a phase difference per unit thickness of more than 20 nm/mm and 50 nm/mm or less and a standard deviation of the phase difference of more than 10 nm/mm and 20 nm/mm or less;

a second step of cutting out a diamond seed crystal from the single-crystal diamond material; and a third step of growing a diamond crystal on the diamond seed crystal by a temperature difference method to manufacture the single-crystal diamond.

This can provide a single-crystal diamond with fewer crystal defects and less distortion.

(7) Preferably, the diamond seed crystal does not have a defect observed in an etching test. This reduces defects in the single-crystal diamond and further reduces the distortion of the single-crystal diamond.

(8) Preferably, the diamond seed crystal does not have a defect observed in an X-ray topographic image. This reduces defects in the single-crystal diamond and further reduces the distortion of the single-crystal diamond.

(9) Preferably, in the second step, the diamond seed crystal is cut out from a growth sector other than the {111} sector among the growth sectors of the single-crystal diamond material.

This reduces defects in the diamond seed crystal. This reduces defects in the single-crystal diamond and further reduces the distortion of the single-crystal diamond.

(10) The present disclosure provides a method of manufacturing a single-crystal diamond plate having a (111) plane as a main surface, the method including:

a 1A step of preparing a single-crystal diamond material with an average of a phase difference per unit thickness of more than 20 nm/mm and 50 nm/mm or less and a standard deviation of the phase difference of more than 10 nm/mm and 20 nm/mm or less;

a 2A step of cutting out a diamond seed crystal having (111) as a main surface from the single-crystal diamond material to manufacture a {111} diamond seed crystal;

a 3A step of growing a diamond crystal on the {111} diamond seed crystal by a temperature difference method to manufacture a single-crystal diamond; and a 4A step of cutting out a plate from a {100} sector of the single-crystal diamond to manufacture the single-crystal diamond plate having the (111) plane as a main surface.

This can provide a single-crystal diamond plate that has fewer crystal defects and less distortion and has a (111) plane as a main surface. The single-crystal diamond plate used for a material for a magnetic sensor improves the sensitivity of the magnetic sensor.

Details of Embodiments of Present Disclosure

Specific examples of a single-crystal diamond according to the present disclosure and a method of manufacturing the single-crystal diamond are described below with reference to the accompanying drawings. In the present disclosure, like reference numerals denote like parts or equivalents thereof throughout the figures. For the sake of clarity and simplification of the drawings, the dimensions, such as length, width, thickness, and depth, are appropriately modified and do not necessarily represent actual dimensions.

The notation "A to B", as used herein, refers to the upper and lower limits of the range (that is, A or more and B or less). When the unit is not described in A but is described in B, the unit of A and the unit of B are the same.

In the crystallographic description herein, ( ) indicates an individual plane, and { } indicates a group plane.

In the present disclosure, when one or more numerical values are described as each of the lower limit and the upper limit of the numerical range, a combination of any one numerical value described as the lower limit and any one numerical value described as the upper limit is also disclosed. For example, when a1 or more, b1 or more, and c1 or more are described as lower limits and a2 or less, b2 or less, and c2 or less are described as upper limits, it is assumed that a1 to a2, a1 to b2, a1 to c2, b1 to a2, b1 to b2, b1 to c2, c1 to a2, c1 to b2, and c1 to c2 are disclosed.

First Embodiment: Single-Crystal Diamond

A single-crystal diamond according to an embodiment of the present disclosure (hereinafter also referred to as "the present embodiment")

has a nitrogen content based on the number of atoms of more than 0.1 ppm and 50 ppm or less, has a boron content based on the number of atoms of 0.1 ppm or less, and has an average of a phase difference per unit thickness of 20 nm/mm or less, wherein the phase difference has a standard deviation of 10 nm/mm or less.

(Nitrogen Content and Boron Content)

The nitrogen content based on the number of atoms (hereinafter also referred to as the "nitrogen content") of the single-crystal diamond according to the present embodiment is more than 0.1 ppm and 50 ppm or less, and the boron content based on the number of atoms (hereinafter also referred to as the "boron content") of the single-crystal diamond is 0.1 ppm or less. Nitrogen and boron in a single-crystal diamond cause a crystal defect and distortion. The single-crystal diamond according to the present embodiment with a nitrogen content and a boron content in the above ranges has fewer crystal defects and less distortion.

The lower limit of the nitrogen content of the single-crystal diamond is more than 0.1 ppm, preferably 0.2 ppm or more, preferably 0.3 ppm or more, preferably 0.8 ppm or more, more preferably 1.9 ppm or more. The upper limit of the nitrogen content of the single-crystal diamond is 50 ppm or less, preferably 42 ppm or less, preferably 30 ppm or less, more preferably 10 ppm or less. The nitrogen content of the single-crystal diamond is more than 0.1 ppm and 50 ppm or less, preferably 0.2 ppm to 42 ppm, preferably 0.2 ppm to 30 ppm, more preferably 0.3 ppm to 10 ppm.

The upper limit of the boron content of the single-crystal diamond is 0.1 ppm or less, preferably 0.01 ppm or less, more preferably 0.001 ppm or less. The lower limit of the boron content of the single-crystal diamond is preferably 0 ppm or more. From the perspective of manufacture, the lower limit of the boron content may be 0.0001 ppm or more. The boron content of the single-crystal diamond preferably ranges from 0 ppm to 0.1 ppm, preferably 0 ppm to 0.01 ppm, preferably 0 ppm to 0.001 ppm, more preferably 0.0001 ppm to 0.1 ppm, more preferably 0.0001 ppm to 0.01 ppm, still more preferably 0.0001 ppm to 0.001 ppm.

The nitrogen content of the single-crystal diamond more preferably ranges from 0.2 ppm to 30 ppm, and the boron content of the single-crystal diamond more preferably ranges from 0.0001 ppm to 0.001 ppm. The nitrogen content of the single-crystal diamond still more preferably ranges from 0.3 ppm to 10 ppm, and the boron content of the single-crystal diamond still more preferably ranges from 0.0001 ppm to 0.001 ppm.

The nitrogen content and the boron content of a single-crystal diamond is measured by secondary ion mass spectrometry (SIMS).

It has been confirmed that the nitrogen content and the boron content do not vary with the measurement point in a single-crystal diamond.

(Phase Difference)

A diamond is an isotropic crystal and typically has an isotropic refractive index (a dielectric constant). On the other hand, a diamond with a defect and distortion has a birefringence index. A defect in a diamond irradiated with circularly polarized light causes a phase difference and emits elliptically polarized light (including linearly polarized light). On the other hand, when irradiated with circularly polarized light, a portion other than defects causes no phase difference and emits the circularly polarized light. The optical axis and the phase difference can be determined by determining the directions of the major axis and the minor axis of the ellipse in elliptically polarized light and the ratio of the length of the major axis to the length of the minor axis. Furthermore, a lens and a microscope can be combined to acquire information on a local phase difference in a fine portion. Furthermore, polarizers integrated in front of pixels of a digital detector can be arranged to two-dimensionally acquire information in each pixel (that is, information at a local position of the sample). Such a principle is used to measure the value (nm/mm) of the phase difference per unit thickness of the single-crystal diamond.

The phase difference has a positive correlation with the number of defects and the magnitude of distortion in a single-crystal diamond. The single-crystal diamond according to the present embodiment has an average of a phase difference of 20 nm/mm or less, and the standard deviation of the phase difference is 10 nm/mm or less. Thus, the single-crystal diamond has fewer crystal defects and less distortion.

The upper limit of the average of the phase difference of the single-crystal diamond is 20 nm/mm or less, preferably 18 nm/mm or less, preferably 17.8 nm/mm or less, more preferably 15 nm/mm or less, still more preferably 12 nm/mm or less. The lower limit of the average of the phase difference of the single-crystal diamond is preferably 0 nm/mm or more. The average of the phase difference of the single-crystal diamond preferably ranges from 0 nm/mm to 20 nm/mm, preferably 0 nm/mm to 18 nm/mm, preferably 0 nm/mm to 17.8 nm/mm, preferably 0 nm/mm to 15 nm/mm, preferably 0.1 nm/mm to 18 nm/mm, more preferably 0.2 nm/mm to 15 nm/mm, still more preferably 0.5 nm/mm to 12 nm/mm.

The upper limit of the standard deviation of the phase difference per unit thickness of the single-crystal diamond is 10 nm/mm or less, preferably 8 nm/mm or less, preferably 7.9 nm/mm or less, more preferably 6 nm/mm or less. The lower limit of the standard deviation of the phase difference of the single-crystal diamond is preferably 0 nm/mm or more. From the perspective of manufacture, the lower limit of the standard deviation of the phase difference can be, for example, 0.05 nm/mm or more. The standard deviation of the phase difference of the single-crystal diamond preferably ranges from 0 nm/mm to 10 nm/mm, preferably 0 nm/mm to 8 nm/mm, preferably 0 nm/mm to 7.9 nm/mm, preferably 0.05 nm/mm to 10 nm/mm, preferably 0.05 nm/mm to 8 nm/mm, preferably 0.05 nm/mm to 6 nm/mm, more preferably 0.1 nm/mm to 8 nm/mm, still more preferably 0.2 nm/mm to 6 nm/mm.

The phase difference per unit thickness of a single-crystal diamond is measured by the following procedure. First, the surface of the single-crystal diamond is polished and finished to a state in which no streaks due to damage at the time of polishing are seen with a phase-contrast microscope (a birefringence distribution measuring apparatus). The polishing method is a method capable of finish processing without damage, such as skeif polishing or glass polishing. It has been confirmed that polishing by this polishing method does not affect the original phase difference of a single-crystal diamond.

Next, the phase difference of a single-crystal diamond is measured with a birefringence distribution measuring apparatus ("WPA-micro" (trademark), "WPA-100" (trademark)), or "PA-300" (trademark) manufactured by Photonic Lattice, Inc.). A measurement region in a polished surface of a single-crystal diamond is irradiated with light in a direction perpendicular to the polished surface. The shape of the measurement region is made rectangular, circular, or polygonal by masking that matches to the polished surface to be measured. The shape of the measurement region is a rectangle with a side in the range of 1 mm to 10 mm, a circle with a diameter in the range of 1 mm to 10 mm, or a polygon (with an area in the range of 1 $mm^2$ to 100 $mm^2$) corresponding to the shape of the polished measurement surface. In this measurement region, the measurement is performed after confirming that no damage due to polishing is observed on the sample surface with a phase-contrast microscope (a birefringence distribution measuring apparatus). The measurement conditions include a measurement wavelength of 850 nm and 50 scans (high-precision measurement conditions). Although a phase difference of more than 90 degrees (¼ of the wavelength) is usually difficult to discriminate, this birefringence distribution measuring apparatus uses an integrated wave plate system instead of an integrated polarizer system, and the measurement range is extended to a phase difference of 180 degrees (½ of the wavelength). It has been experimentally verified that the use of three wavelengths (one center wavelength and two wavelengths close to the center wavelength) extends the measurement range to five to six times the wavelength. The frequency distribution of the phase difference, the average of the phase difference, and the standard deviation of the phase difference in the measurement region are calculated by performing surface measurement of the measurement region with the birefringence distribution measuring apparatus and processing the measured values using software ("PA-View" (trademark) manufactured by Photonic Lattice, Inc.).

The value obtained by dividing the average of the phase difference (nm) in the measurement region by the thickness (mm) of the measurement sample corresponds to "the average of the phase difference per unit thickness (nm/mm) of a single-crystal diamond". The value obtained by dividing the standard deviation of the phase difference (nm) by the thickness (mm) of the measurement sample corresponds to "the standard deviation of the phase difference per unit thickness (nm/mm) of a single-crystal diamond".

It has been confirmed that the average value and the standard deviation of the phase difference do not vary even if the setting position in the measurement region in a single-crystal diamond is changed in the polished surface.
(Dislocation Density)

Preferably, the single-crystal diamond according to the present embodiment has a dislocation density of $10^2/cm^2$ or less, and the dislocation density is measured in an etching test. The term "dislocation density", as used herein, refers to a measure indicating the amount of dislocation derived from a needle-like defect linearly extending in a single-crystal diamond, and is measured in an etching test described later. More specifically, the dislocation density corresponds to the number of inverted-quadrangular-pyramid-shaped etch pits per unit area in an etching test described later. A needle-like defect causes lower crystallinity. The single-crystal diamond according to the present embodiment has a dislocation density of $10^2/cm^2$ or less and has high crystallinity due to fewer needle-like defects.

The upper limit of the dislocation density of the single-crystal diamond is preferably $10^2/cm^2$ or less, preferably 95/$cm^2$ or less, preferably 65/$cm^2$ or less, more preferably 10/$cm^2$ or less, still more preferably 1/$cm^2$ or less. The lower limit of the dislocation density of the single-crystal diamond is preferably 0/$cm^2$ or more. From the perspective of manufacture, the lower limit of the dislocation density may be 1/$cm^2$ or more. The dislocation density of the single-crystal diamond preferably ranges from 0/$cm^2$ to $10^2/cm^2$, preferably 0/$cm^2$ to 95/$cm^2$, preferably 0/$cm^2$ to 65/$cm^2$, more preferably 0/$cm^2$ to 10/$cm^2$, still more preferably 0/$cm^2$ to 1/$cm^2$.

The dislocation density of a single-crystal diamond is measured in an etching test. More specifically, it is measured by the following procedure.

A single-crystal diamond is immersed in a potassium nitrate ($KNO_3$) melt etchant and is heated in a platinum crucible at 600° C. for 1 hour (etching). After slow cooling, the single-crystal diamond is taken out, and the surface is observed with an optical microscope at a magnification of 50 times. The number of point-like etch pits is counted in a 1000 μm×1000 μm rectangular measurement region to obtain the number of point-like etch pits per $mm^2$. The term "point-like etch pit", as used herein, refers to a point-like depression in a single-crystal diamond surface. The depression is a tetragon, a tetragon with rounded corners, or an approximate circle on the (100) plane of a single-crystal diamond, or a triangle, a triangle with rounded corners, or an approximate circle on the (111) plane of the single-crystal diamond, and the distance across the depression ranges from approximately 1 μm to 50 μm. The number of point-like etch pits per $cm^2$ is calculated by multiplying the number of point-like etch pits per $mm^2$ by 100. In the present description, the number of point-like etch pits per $cm^2$ corresponds to the dislocation density. Linear etch pits as well as point-like etch pits may be observed on the surface of a single-crystal diamond after etching. The linear etch pits originate from stacking faults in a single-crystal diamond. In the measurement of the dislocation density, the number of linear etch pits is not counted.

In a single-crystal diamond, five measurement regions are determined. The average of the numbers of point-like etch pits per $cm^2$ in the five measurement regions is defined as "the dislocation density of the single-crystal diamond" in the present embodiment. It has been confirmed that the dislocation density does not vary even if the setting position in the measurement region in a single-crystal diamond is changed. The number of point-like etch pits in the same measurement region was counted by a plurality of different observers, and it has been confirmed that the same measurement results were obtained by all the observers. In other words, it has been confirmed that the measurement results do not vary depending on the observer.
(First Region)

Preferably, the single-crystal diamond according to the present embodiment includes a first region of 1 $mm^2$, the first region does not include a defect, and the presence or absence of defects is determined in an X-ray topographic image of the single-crystal diamond. A defect in a single-crystal diamond may be a point defect, such as a vacancy, a linearly extending needle-like defect, an impurity, a stacking fault, a distortion, or the like. Among these defects, a needle-like defect and a stacking fault can be identified in an X-ray topographic image. A portion of a needle-like defect or a stacking fault has higher X-ray reflection intensity than the rest of the crystal (a portion with fewer defects, that is, a portion with high crystallinity) and, in an X-ray topographic image, is indicated as a dark portion in a positive image and as a bright portion in a negative image. A single-crystal diamond without a defect observed in an X-ray topographic image has high crystallinity. The dark portion or the bright portion in an X-ray topographic image is visually observed. The presence or absence of defects in the same X-ray topographic image was determined by a plurality of different observers, and it has been confirmed that the same measurement results were obtained by all the observers. In other words, it has been confirmed that the measurement results do not vary depending on the observer.

An X-ray topographic image is captured by the following method. MoKα1 radiation (λ=0.71 A) is used as an X-ray source, and an X-ray topographic image by diffraction of a (220) plane of a diamond crystal is captured with a Lang camera. To make the distribution state of defects easier to understand, a sample is preferably processed into a sheet with a thickness of approximately 0.5 mm. This processing is performed by cutting out a sheet with a laser processing machine and flattening the section by skeif polishing. Alternatively, the presence or absence of defects in a relatively thick sample can be determined without processing the sample into a sheet by placing a slit on the X-ray side and taking a topograph (limited projection topograph) using a diffraction line from only a limited layer inside the sample.

(Crack Initiation Load)

The crack initiation load of the single-crystal diamond according to the present embodiment is preferably 10 N or more. This provides the single-crystal diamond with high breaking strength and fracture resistance.

The lower limit of the crack initiation load of the single-crystal diamond is preferably 10 N or more, more preferably 12 N or more, still more preferably 15 N or more. The upper limit of the crack initiation load is preferably, but not limited to, 50 N or less from the perspective of manufacture. The single-crystal diamond preferably has a crack initiation load in the range of 10 N to 50 N, more preferably 12 N to 50 N, still more preferably 15 N to 50 N.

The crack initiation load of a single-crystal diamond is measured by the following procedure. A spherical diamond indenter with a tip radius (R) of 50 μm is pressed against the (100) plane of a single-crystal diamond. In this state, a load is applied to the single-crystal diamond at a loading rate of 100 N/min, and the load at the moment of crack initiation in the single-crystal diamond (crack initiation load) is measured. The moment of crack initiation is measured with an AE sensor. The measurement temperature is 25° C. A larger crack initiation load indicates that the sample has higher strength and fracture resistance. When an indenter with a tip radius (R) of less than 50 μm is used as a measuring indenter, the sample is plastically deformed before crack initiation, and accurate strength against cracking cannot be measured. An indenter with a tip radius (R) of more than 50 μm may be used for the measurement but causes the problems of an increased load required for crack initiation, an increased contact area between the indenter and the sample, a significant influence of the surface accuracy of the sample on the accuracy of measurement, and a significant influence of the crystal orientation of a single crystal. Thus, in a breaking strength test of a synthetic single-crystal diamond, an indenter with a tip radius (R) of 50 μm is preferably used.

(Vicinal Growth Trace)

The single-crystal diamond preferably has a vicinal growth trace. The single-crystal diamond with a vicinal growth trace has high crystallinity. The single-crystal diamond with a vicinal growth trace is synthesized by a temperature difference method at high pressure and temperature. Further optimizing the synthesis conditions while reducing crystal defects and distortion in the temperature difference method allows a vicinal growth trace to be observed in the synthesized single-crystal diamond. A single-crystal diamond synthesized by a CVD method has low crystallinity and does not have a vicinal growth trace.

In the present description, the presence or absence of a vicinal growth trace in a single-crystal diamond is determined in a UV (with a wavelength of 200 nm or less) excited emission image of the single-crystal diamond. More specifically, it is determined by the following procedure.

A single-crystal diamond is processed into a sheet parallel to (100) by laser processing or polishing. This is irradiated with ultraviolet radiation having a wavelength of 200 nm, and the resulting fluorescence distribution image is captured. A vicinal growth trace in the single-crystal diamond is identified, for example, as an X-shaped line.

(Applications)

The single-crystal diamond according to the present embodiment can be used in known applications, such as optical components, laser windows, crystals for spectroscopy, monochromators, anvils for ultra-high pressure generators, and semiconductor diamond substrates. The single-crystal diamond according to the present embodiment has fewer crystal defects and less distortion and can therefore be suitable for use particularly in applications of precision cutting tools, infrared optical components (for example, window materials for lasers, pressure cells, and prisms), and materials for magnetic sensors.

Second Embodiment: Method of Manufacturing Single-Crystal Diamond

A method of manufacturing the single-crystal diamond according to the present embodiment is a method of manufacturing the single-crystal diamond according to the first embodiment, the method including:

a first step of preparing a single-crystal diamond material with an average of a phase difference per unit thickness of more than 20 nm/mm and 50 nm/mm or less and a standard deviation of the phase difference of more than 10 nm/mm and 20 nm/mm or less;

a second step of cutting out a diamond seed crystal from the single-crystal diamond material; and a third step of growing a diamond crystal on the diamond seed crystal by a temperature difference method to manufacture the single-crystal diamond.

(First Step)

First, prepare a single-crystal diamond material with an average of a phase difference per unit thickness of more than 20 nm/mm and 50 nm/mm or less and a standard deviation of the phase difference of more than 10 nm/mm and 20 nm/mm or less. The phase difference of the single-crystal diamond material is measured by the same method as the method of measuring the phase difference described in the first embodiment. Thus, in the following second step, it is possible to manufacture a diamond seed crystal with less distortion in which the average of the phase difference per unit thickness is 20 nm/mm or less and the standard deviation of the phase difference is 10 nm/mm or less.

The single-crystal diamond material can be a single-crystal diamond synthesized by a temperature difference method. The conditions of the temperature difference method are, for example, as follows: the solvent metal composition is Fe/Co=10/90 to 90/10 (mass ratio), 0.5% by mass or more and less than 1.5% by mass of Ti or Al is added as a nitrogen getter to the solvent metal, the temperature gradient is adjusted such that the temperature difference between carbon and a seed crystal ranges from 15° C. to 28°

C., and a pressure in the range of 5.0 GPa to 5.5 GPa and a temperature in the range of 1300° C. to 1350° C. are held for 120 hours to 160 hours. A temperature difference of more than 28° C. tends to result in irregular crystal growth and no vicinal growth trace. A temperature difference of less than 15° C. results in a long time to grow a crystal of a predetermined size and causes a problem of manufacturing costs. The temperature change during holding is controlled within ±3° C. This further improves the crystallinity. A temperature change of more than ±3° C. results in unstable growth, the occurrence of crystal defects, distortion, contamination of inclusions, and the like, and lower crystallinity. These conditions are not employed in the known temperature difference method.

(Second Step)

Next, a diamond seed crystal is cut out from the single-crystal diamond material. To cut out a diamond seed crystal, preferably, a sheet with a thickness in the range of approximately 0.3 to 0.5 mm is cut out by laser processing, the section is polished to a mirror surface, and a sheet with a size in the range of approximately 0.5 mm×0.5 mm×0.3 mm to 1.0 mm×1.0 mm×0.5 mm is then cut out by laser cutting. This can reduce the cutting margin and provide a seed crystal with a seed surface with less damage. Preferably, the seed surface (crystal growth surface) of the diamond seed crystal is tetragonal or octagonal and has a size (the length of the opposite side) in the range of 0.3 mm to 3 mm.

The diamond seed crystal preferably does not have a defect observed in an etching test. For example, before a diamond seed crystal is cut out from a single-crystal diamond material, preferably, the single-crystal diamond material is subjected to an etching test to specify a region without defects, from which the diamond seed crystal is cut out. The etching test is performed under the same conditions as the etching test described in the first embodiment. Due to the diamond seed crystal without defects, this reduces defects in the single-crystal diamond and further reduces the distortion of the single-crystal diamond.

The diamond seed crystal preferably does not have a defect observed in an X-ray topographic image. For example, before a diamond seed crystal is cut out from a single-crystal diamond material, preferably, an X-ray topographic image of the single-crystal diamond material is taken to specify a region without defects in the X-ray topographic image, and the diamond seed crystal is cut out from the region. The X-ray topographic image is taken by the method described in the first embodiment. Due to the diamond seed crystal without defects, this reduces defects in the single-crystal diamond and further reduces the distortion of the single-crystal diamond.

In a single-crystal diamond material synthesized by a temperature difference method, a growth sector other than the {111} sector, such as a {001} sector, a {113} sector, a {115} sector, a {110} sector, or a {135} sector, has fewer defects, and the {111} sector has more defects. The term "{abc} sector", as used herein, refers to a region in which {abc} planes overlap and grow. More specifically, the {001} sector refers to a region in which the {001} planes overlap and grow. Thus, in the second step, cutting out a diamond seed crystal from a portion other than the {111} sector of a single-crystal diamond material reduces defects in the diamond seed crystal, reduces defects in the resulting single-crystal diamond, and further reduces the distortion of the single-crystal diamond. A growth sector other than the {111} sector of a single-crystal diamond material is, for example, the {001} sector, the {113} sector, the {115} sector, the {110} sector, the {135} sector, or a sector which can exist crystallographically. When a diamond seed crystal is cut out from a single-crystal diamond material, as long as the {111} sector is not included, the diamond seed crystal may be cut out from one sector other than the {111} sector or may be cut out so as to include two or more sectors.

In a single-crystal diamond material, the region of each sector can be specified in an emission image by ultraviolet radiation (a UV-excited emission image).

(Third Step)

Next, a diamond crystal is grown on the diamond seed crystal by a temperature difference method to manufacture a single-crystal diamond. This can provide a single-crystal diamond with fewer crystal defects and less distortion.

The temperature difference method in the third step is performed, for example, in a sample chamber with the structure illustrated in FIG. 1.

As illustrated in FIG. 1, a sample chamber 10 used to manufacture a single-crystal diamond 1 includes an insulator 2, a carbon source 3, a solvent metal 4, and a diamond seed crystal 5 in a space surrounded by a graphite heater 7, and includes a pressure medium 6 outside the graphite heater 7. The temperature difference method is a synthesis method of providing a vertical temperature gradient in the sample chamber 10, placing the carbon source 3 in a high-temperature portion ($T_{high}$), placing the diamond seed crystal 5 in a low-temperature portion ($T_{low}$), placing the solvent metal 4 between the carbon source 3 and the diamond seed crystal 5, and growing the single-crystal diamond 1 on the diamond seed crystal 5 at a temperature not lower than the temperature at which the solvent metal 4 melts and at a pressure not lower than the pressure at which the diamond is thermally stable.

The carbon source 3 is preferably a diamond powder. Graphite or pyrolytic carbon may also be used. The solvent metal 4 may be one or more metals selected from iron (Fe), cobalt (Co), nickel (Ni), manganese (Mn), and the like, or an alloy containing these metals. However, Ni and Mn are preferably not used because a trace amount of Ni or Mn may be incorporated into diamond depending on synthesis conditions. The amount of impurity boron in the carbon source and in the solvent metal is preferably controlled to 1 ppm or less. Thus, the boron content based on the number of atoms of the single-crystal diamond can be 0.1 ppm or less. Aluminum (Al) may be added as a nitrogen getter. In this case, an Fe—Al alloy may be used as a solvent.

Titanium (Ti) is preferably added as a nitrogen getter to the solvent metal 4 at a concentration of 0.2% by mass or more and less than 1.5% by mass. This can control the nitrogen content based on the number of atoms of the single-crystal diamond to be more than 0.1 ppm and 50 ppm or less.

The conditions of the temperature difference method are, for example, as follows: the temperature gradient is adjusted such that the temperature difference between carbon and a seed crystal ranges from 15° C. to 28° C., and a pressure in the range of 5.0 GPa to 5.5 GPa and a holding temperature in a low-temperature portion in the range of 1300° C. to 1350° C. are held for 120 hours to 160 hours. A temperature difference of more than 28° C. often results in slightly irregular crystal growth and no vicinal growth. The temperature change during holding is controlled within ±3° C. to further improve the crystallinity. These conditions are not employed in the known temperature difference method.

Third Embodiment: Single-Crystal Diamond Plate

A single-crystal diamond plate according to an embodiment of the present disclosure is a single-crystal diamond plate that is made of the single-crystal diamond according to the first embodiment and has a (111) plane as a main surface. The single-crystal diamond plate has fewer crystal defects and less distortion. Thus, it is suitable for use in a magnetic sensor.

In the single-crystal diamond plate, the (111) plane as the main surface can be identified by X-ray diffraction or in a UV-excited emission image.

Fourth Embodiment: Method of Manufacturing Single-Crystal Diamond Plate

A method of manufacturing a single-crystal diamond plate according to an embodiment of the present disclosure is a method of manufacturing a single-crystal diamond plate having a (111) plane as a main surface, the method including:

a 1A step of preparing a single-crystal diamond material with an average of a phase difference per unit thickness of more than 20 nm/mm and 50 nm/mm or less and a standard deviation of the phase difference of more than 10 nm/mm and 20 nm/mm or less;

a 2A step of cutting out a diamond seed crystal having (111) as a main surface from the single-crystal diamond material to manufacture a {111} diamond seed crystal;

a 3A step of growing a diamond crystal on the {111} diamond seed crystal by a temperature difference method to manufacture a single-crystal diamond; and a 4A step of cutting out a plate from a {100} sector of the single-crystal diamond to manufacture the single-crystal diamond plate having the (111) plane as a main surface.

(1A Step)

The 1A step is the same as the first step of the second embodiment.

(2A Step)

Next, a diamond seed crystal having (111) as a main surface is cut out from the single-crystal diamond material to manufacture a {111} diamond seed crystal. The 2A step may be the same as the second step of the second embodiment except that the diamond seed crystal having (111) as a main surface is cut out from the single-crystal diamond material when the diamond seed crystal is cut out from the single-crystal diamond material.

(3A Step)

Next, a diamond crystal is grown on the {111} diamond seed crystal by a temperature difference method to manufacture a single-crystal diamond. The 3A step may be the same as the third step of the second embodiment except that the {111} diamond seed crystal is used as a diamond seed crystal.

(4A Step)

A plate is cut out from a {100} sector of the single-crystal diamond to manufacture a single-crystal diamond plate having the (111) plane as a main surface. The diamond plate has fewer crystal defects and less distortion. The single-crystal diamond plate used for a material for a magnetic sensor improves the sensitivity of the magnetic sensor. The diamond plate is preferably a single-crystal diamond plate that is made of the single-crystal diamond according to the first embodiment and has a (111) plane as a main surface. Preferably, the diamond plate has a nitrogen content based on the number of atoms of more than 0.1 ppm and 50 ppm or less, a boron content based on the number of atoms of 0.1 ppm or less, and an average of a phase difference per unit thickness of 20 nm/mm or less, and the standard deviation of the phase difference is 10 nm/mm or less.

The plate is preferably cut out with a laser processing machine. This enables cutting with less damage and a smaller cutting margin.

Appendix 1

The nitrogen content based on the number of atoms of a single-crystal diamond according to an embodiment of the present disclosure preferably ranges from 0.2 ppm to 42 ppm.

Appendix 2

The boron content based on the number of atoms of a single-crystal diamond according to an embodiment of the present disclosure preferably ranges from 0 ppm to 0.1 ppm.

The boron content based on the number of atoms of a single-crystal diamond according to an embodiment of the present disclosure preferably ranges from 0 ppm to 0.01 ppm.

The boron content based on the number of atoms of a single-crystal diamond according to an embodiment of the present disclosure preferably ranges from 0.0001 ppm to 0.1 ppm.

Appendix 3

The average of the phase difference per unit thickness of a single-crystal diamond according to an embodiment of the present disclosure preferably ranges from 0 nm/mm to 20 nm/mm.

The average of the phase difference per unit thickness of a single-crystal diamond according to an embodiment of the present disclosure preferably ranges from 0 nm/mm to 17.8 nm/mm.

The average of the phase difference per unit thickness of the single-crystal diamond according to the present embodiment preferably ranges from 0.1 nm/mm to 20 nm/mm.

Appendix 4

The standard deviation of the phase difference of a single-crystal diamond according to an embodiment of the present disclosure preferably ranges from 0 nm/mm to 10 nm/mm.

The standard deviation of the phase difference of a single-crystal diamond according to an embodiment of the present disclosure preferably ranges from 0 nm/mm to 7.9 nm/mm.

The standard deviation of the phase difference of a single-crystal diamond according to an embodiment of the present disclosure preferably ranges from 0.05 nm/mm to 10 nm/mm.

Appendix 5

In a method of manufacturing a single-crystal diamond according to an embodiment of the present disclosure, in the third step, a diamond powder is preferably used as a carbon source, and one or more metals selected from the group consisting of iron (Fe), cobalt (Co), nickel (Ni), and manganese (Mn) or an alloy containing these metals is preferably used as a solvent metal.

The solvent metal preferably contains titanium (Ti) as a nitrogen getter at a concentration of 0.2% by mass or more and less than 1.5% by mass.

Appendix 6

In a method of manufacturing a single-crystal diamond according to an embodiment of the present disclosure, the conditions of the temperature difference method are preferably a temperature difference between carbon and a seed crystal in the range of 15° C. to 28° C., a pressure of 5.0 GPa to 5.5 GPa, a holding temperature of a low-temperature portion in the range of 1300° C. to 1350° C., and a holding time in the range of 120 hours to 160 hours.

Appendix 7

A single-crystal diamond plate according to an embodiment of the present disclosure is a single-crystal diamond plate that is made of the single-crystal diamond according to the first embodiment and has a (111) plane as a main surface.

EXAMPLES

The present embodiment is more specifically described with reference to examples. However, the present embodiment is not limited by these examples.

Manufacture of Single-Crystal Diamond

A single-crystal diamond material manufactured by a temperature difference method was prepared. The "Average phase difference" and the "standard deviation of the phase difference" of a single-crystal diamond material used in each sample are shown in "Average" and "Deviation" columns of "Phase difference (nm/mm)" in Table 1.

to include the (100) sector and the (111) sector. The presence or absence of defects in the diamond seed crystal was determined in an etching test and in an X-ray topographic image. The results are shown in the columns of "Etching test" and "X-ray topographic image" of "Presence or absence of defects" of "Diamond seed crystal" in Table 1.

Next, a diamond crystal is grown on the diamond seed crystal by the temperature difference method to manufacture a single-crystal diamond of each sample. The temperature difference method is performed in a sample chamber with the structure illustrated in FIG. 1. A diamond powder containing 100 to 200 ppm of nitrogen and 0.5 to 1 ppm of boron as impurities is used as a carbon source. High-purity Fe and Co are used as solvent metals, and the solvent composition is Fe:Co=55:45 by mass ratio. Ti is added to the solvent metals in an amount (0.2% to 1.4% by mass) shown in the column of "Ti addition amount" in Table 1. The conditions of the temperature difference method in each sample are as follows: the temperature difference between a high-temperature portion (carbon source) and a low-temperature portion (seed crystal) is 23° C., the pressure is 5.3 GPa, and the holding temperature of the low-temperature portion is 1320° C. The holding time is 120 hours, and the temperature change during holding is controlled within ±3° C.

Evaluation

The single-crystal diamond of each sample was measured or confirmed with respect to the average of the phase difference per unit thickness, the standard deviation of the

TABLE 1

| | Single-crystal diamond material | | Diamond seed crystal Presence or absence | | | Temperature difference method | | | | |
| | | | Seed | of defects | | Ti | | | | |
| Sample No. | Phase difference (nm/mm) Average | Deviation | crystal cutting sector | Etching test | X-ray topographic image | addition amount (mass %) | Pressure (GPa) | Temperature (° C.) | Temperature difference (° C.) | Holding time (h) |
|---|---|---|---|---|---|---|---|---|---|---|
| 1 | 26.4 | 12.4 | (100) | Absent | Absent | 0.2 | 5.3 | 1320 | 23 | 120 |
| 2 | 34.2 | 14.2 | (100) | Absent | Absent | 0.5 | 5.3 | 1320 | 23 | 120 |
| 3 | 45.3 | 17.8 | (100) | Absent | Absent | 0.8 | 5.3 | 1320 | 23 | 120 |
| 4 | 22.6 | 10.0 | (100) | Absent | Absent | 1.0 | 5.3 | 1320 | 23 | 120 |
| 5 | 31.4 | 9.1 | (100) + (111) | Absent | Present (partly stacking fault) | 1.2 | 5.3 | 1320 | 23 | 120 |
| 6 | 42.3 | 16.1 | (100) + (111) | Absent | Present (partly stacking fault) | 1.4 | 5.3 | 1320 | 23 | 120 |

Next, a diamond seed crystal with a size of 0.75 mm×0.75 mm×0.5 mm is cut out from the single-crystal diamond material using a laser processing machine. The diamond seed crystal is cut out from a sector described in the column of "Seed crystal cutting sector" of "Single-crystal diamond material" in Table 1 of the single-crystal diamond material. In this column, "(100)" means cutting out from the (100) sector. Furthermore, "(100)+(111)" means cutting out so as phase difference, the nitrogen content, the boron content, the dislocation density, the presence or absence of defects in the first region, the crack initiation load, and the presence or absence of a vicinal growth trace. The results are shown in the columns of "Average", "Deviation", "N content", "B content", "Dislocation density", "Defect in first region", "Crack initiation load", and "Vicinal growth trace" of "Phase difference" in Table 2.

TABLE 2

| Sample No. | Phase difference (nm/mm) | | N content (ppm) | B content (ppm) | Dislocation density (/cm$^2$) | Defect In first region Present/absent | Crack initiation load (N) | Vicinal growth trace Present/absent |
|---|---|---|---|---|---|---|---|---|
| | Average | Deviation | | | | | | |
| 1 | 3.2 | 2.2 | 42.0 | 0.01 | 3 | Absent | 17 | Present |
| 2 | 10.1 | 5.2 | 12.0 | 0.01 | 5 | Absent | 15 | Absent |
| 3 | 17.8 | 7.9 | 5.0 | 0.01 | 12 | Absent | 8 | Absent |
| 4 | 2.8 | 1.5 | 1.9 | 0.01 | 10 | Absent | 18 | Present |
| 5 | 8.5 | 5.2 | 0.8 | 0.01 | 65 | Present | 14 | Present |
| 6 | 16.3 | 8.0 | 0.2 | 0.01 | 95 | Present | 12 | Absent |

Discussion

The manufacturing methods of Samples 1 to 6 correspond to examples. It has been confirmed that the single-crystal diamonds of Samples 1 to 6 manufactured by these manufacturing methods have a nitrogen content based on the number of atoms of more than 0.1 ppm and 50 ppm or less, a boron content based on the number of atoms of 0.1 ppm or less, an average of a phase difference per unit thickness of 20 nm/mm or less, and a standard deviation of the phase difference of 10 nm/mm or less, correspond to examples, and have fewer crystal defects and less distortion. The measurement limit of the boron content by SIMS is 0.01 ppm. Thus, in Samples 1 to 6, a "B content" of 0.01 ppm in Table 2 indicates that the boron content is 0.01 ppm or less.

Although the embodiments and examples of the present disclosure have been described above, appropriate combinations and various modifications of the constituents of the embodiments and examples are also originally envisaged.

It is to be understood that the embodiments and examples disclosed above are illustrated by way of example and not by way of limitation in all respects. The scope of the present invention is defined by the appended claims rather than by the embodiments and examples described above. All modifications that fall within the scope of the claims and the equivalents thereof are therefore intended to be embraced by the claims.

REFERENCE SIGNS LIST 1 single-crystal diamond
2 insulator
3 carbon source
4 solvent metal
5 diamond seed crystal
6 pressure medium
7 graphite heater
10 sample chamber

The invention claimed is:

1. A single-crystal diamond, wherein
the single-crystal diamond has a nitrogen content based on the number of atoms of more than 0.1 ppm and 50 ppm or less,
the single-crystal diamond has a boron content based on the number of atoms of 0.1 ppm or less,
the single-crystal diamond has an average of a phase difference per unit thickness of 20 nm/mm or less, and
the phase difference has a standard deviation of 10 nm/mm or less.

2. The single-crystal diamond according to claim 1, wherein
the single-crystal diamond has a dislocation density of 10$^2$/cm$^2$ or less, and
the dislocation density is measured in an etching test.

3. The single-crystal diamond according to claim 1, wherein
the single-crystal diamond has a first region of 1 mm$^2$,
the first region has no defect, and
the presence or absence of the defect is determined in an X-ray topographic image of the single-crystal diamond.

4. The single-crystal diamond according to claim 1, wherein the single-crystal diamond has a crack initiation load of 10 N or more.

5. The single-crystal diamond according to claim 1, wherein the single-crystal diamond has a vicinal growth trace.

6. A method of manufacturing the single-crystal diamond according to claim 1, the method comprising:
a first step of preparing a single-crystal diamond material with an average of a phase difference per unit thickness of more than 20 nm/mm and 50 nm/mm or less and a standard deviation of the phase difference of more than 10 nm/mm and 20 nm/mm or less;
a second step of cutting out a diamond seed crystal from the single-crystal diamond material; and
a third step of growing a diamond crystal on the diamond seed crystal by a temperature difference method to manufacture the single-crystal diamond.

7. The method of manufacturing the single-crystal diamond according to claim 6, wherein the diamond seed crystal does not have a defect observed in an etching test.

8. The method of manufacturing the single-crystal diamond according to claim 6, wherein the diamond seed crystal does not have a defect observed in an X-ray topographic image.

9. The method of manufacturing the single-crystal diamond according to claim 6, wherein in the second step the diamond seed crystal is cut out from a growth sector other than a {111} sector among growth sectors of the single-crystal diamond material.

10. A method of manufacturing a single-crystal diamond plate having a (111) plane as a main surface, the method comprising:
a 1A step of preparing a single-crystal diamond material with an average of a phase difference per unit thickness of more than 20 nm/mm and 50 nm/mm or less and a standard deviation of the phase difference of more than 10 nm/mm and 20 nm/mm or less;
a 2A step of cutting out a diamond seed crystal having (111) as a main surface from the single-crystal diamond material to manufacture a {111} diamond seed crystal;
a 3A step of growing a diamond crystal on the {111} diamond seed crystal by a temperature difference method to manufacture a single-crystal diamond; and a 4A step of cutting out a plate from a {100} sector of the single-crystal diamond to manufacture the single-crystal diamond plate having the (111) plane as a main surface.

* * * * *